United States Patent [19]
Walsh

[11] Patent Number: 6,160,398
[45] Date of Patent: Dec. 12, 2000

[54] ADAPTIVE RECONSTRUCTION OF PHASED ARRAY NMR IMAGERY

[75] Inventor: David O. Walsh, Tucson, Ariz.

[73] Assignee: Vista Clara, Inc., Tucson, Ariz.

[21] Appl. No.: 09/346,809

[22] Filed: Jul. 2, 1999

[51] Int. Cl.[7] ............................................ G01V 3/00
[52] U.S. Cl. ................................ 324/309; 324/307
[58] Field of Search ................................ 324/309, 307, 324/300

[56] References Cited

U.S. PATENT DOCUMENTS 5,759,152   6/1998   Felmlee et al. ........................ 324/309

OTHER PUBLICATIONS

Constantinides et al A Phased array Coil for Human Cardiac Imaging. Magnetic Resonance Imaging, vol. 34: 92–98 (1995).

Hayes et al, Volume imaging with MR Phased arrays. Magnetic Resonance Imaging vol. 18: 309–319 (1991).

*Primary Examiner*—Christine K. Oda
*Assistant Examiner*—Brij B. Shrivastav
*Attorney, Agent, or Firm*—Mark E. Ogram

[57] ABSTRACT

A method to model the NMR signal and/or noise functions as stochastic processes. Locally relevant statistics for the signal and/or noise processes are derived directly from the set of individual coil images, in the form of array correlation matrices, by averaging individual coil image cross-products over two or more pixel locations. An optimal complex weight vector is computed on the basis of the estimated signal and noise correlation statistics. The weight vector is applied to coherently combine the individual coil images at a single pixel location, at multiple pixel locations, or over the entire image field of view (FOV).

20 Claims, 2 Drawing Sheets

ADAPTIVE RECONSTRUCTION OF PHASED ARRAY NMR IMAGERY

BACKGROUND OF THE INVENTION

Priority for this application is claimed from Provisional Application Ser. No. 60/091,854, filed on Jul. 6, 1998, and entitled "Adaptive Reconstruction and Enhancement of Phased Array NMR Imagery".

The present invention relates generally to medical imagery and more particularly to non-medical applications Nuclear Magnetic Resonance (NMR).

The field of the invention is nuclear magnetic resonance imaging methods and systems. Specifically, the invention addresses the problem of combining a set of nuclear magnetic resonance (NMR) signals, obtained from an array of 2 or more coils, in such a way as to maximize the signal to noise ratio (SNR) or signal to artifact and noise ratio (SANR) in the resulting image.

Signal to noise ratio is, and will continue to be a fundamental limitation for medical applications of magnetic resonance imaging (MRI). A recent trend in MRI is the employment of multi-coil arrays to simultaneously receive and record the NMR signal at various positions around or inside of a patient. A small surface coil has an inherent SNR advantage over a full body coil because of its spatially selective sensitivity profile and its proximity to the source of the desired NMR signal. An array of such coils provides the potential to simultaneously image a large volume while preserving the SNR advantages of a single small surface coil.

In some MRI applications motion-and flow-related artifacts are a significant source of image degradation. Such artifacts are usually manifested as ghost-like replicas of the source object, displaced at periodic or random intervals in the phase encoding dimension. In most cases the source of the artifact is localized (e.g., the aorta or heart).

The optimal method for combining multi-coil NMR image data (the method which yields the maximum possible SNR in the resulting image) is the pixel by pixel implementation of the coherent spatial matched filter. Mathematically, for an array of N surface coils, this procedure is described as:

$$I(x,y) = \Sigma_j m_j^* C_j(x,y)$$

$$m = \alpha R_n^{-1} b$$

where m is an N×1 vector of complex filter coefficients, $R_n$ is the N×N array correlation matrix for the noise process, b is the N×1 vector of complex coil field map values at pixel location (x,y), $\{C_j(x,y), j=1, \ldots, N\}$ are the complex individual coil image pixels, I(x,y) is the reconstructed pixel at location (x,y), and α is an optional scaling parameter. The deterministic matched filter requires a-priori knowledge of the complex near-field sensitivity pattern (b) of each coil, for each location in the volume or slice being imaged. This information is seldom available in practice. Hence, the deterministic matched filter is seldom used in practice.

In the absence of a practical coherent matched filter implementation, sub-optimal method known as the "sum of squares" technique reference (U.S. Pat. No. 4,947,121 and/or Roemer et al., Magnetic Resonance in Medicine, Vol. 16, 192–229, 1990.) has become the standard method of combining multi-coil MR imagery. The sum of squares algorithm operates on a pixel by pixel basis. Each output image pixel is the square root of the sum of the squared magnitudes of the individual coil image pixels. The sum of squares technique is approximately optimal in regions of the image with high SNR. In dark areas, however, background noise is amplified by the approximate factor sqrt(N) as compared to the optimal filter. Also, the sum of squares technique provides no mechanism for suppressing motion and flow artifacts.

A recent development in the field is a phase alignment system for combining coil outputs prior to image formation (U.S. Pat. No. 5,759,152, incorporated hereinto by reference). An initial scout image is used to compute the phase shifts for a single pixel in the center of a region of interest. Computed phase shifts are applied to the outputs of the array elements, and the resulting raw data files are summed coherently prior to image formation. The motivation is to reduce computational requirements and overall reconstruction time. Since this technique neglects magnitude information, it is sub-optimal. In published results the phase alignment technique provided a lower SNR than the sum of squares method. A related technique applies deterministic phase shifting to focus the array of coils on a spatial region of interest in both the transmit and receive modes (U.S Pat. No. 5,252,922, incorporated hereinto by reference). Since this technique also neglects magnitude information, it too is sub-optimal from an SNR standpoint.

There is at least one existing technique that attempts to reduce motion-related artifacts through weighted combination of the individual coil outputs. This technique imposes a spatial weighting function on one or more of the individual coil image (U.S. Pat. No. 5,633,585, incorporated hereinto by reference). The spatial weighting function for each individual coil image is intended to minimize the artifacts particular to that image. As such, the method requires an unspecified manual or automated method of recognizing the artifacts in each individual coil image. Alternately, the magnitude sensitivity function of each coil may be employed as the weighting function for each individual coil image. This requires a –priori knowledge of the individual coil field maps. The method is further limited in that it does not exploit the phase coherence which typically exists between various individual coil image views of a particular artifact. Also, the method is not based upon any rigorous optimization theory or formulae.

It is clear that improvements in NMR imagery will have significant affects upon the care-giver's ability to provide a proper diagnosis.

SUMMARY OF THE INVENTION

The described invention is a new method for combining multi-coil NMR imagery into a composite image with optimal SNR or SANR.

The method models the NMR signal and/or noise functions as stochastic processes. Locally relevant statistics for the signal and/or noise processes are derived directly from the set of individual coil images, in the form of array correlation matrices, by averaging individual coil image cross-products over 2 or more pixel locations. An optimal complex weight vector is computed on the basis of the estimated signal and noise correlation statistics. The weight vector is applied to coherently combine the individual coil images at a single pixel location, at multiple pixel locations, or over the entire image field of view (FOV).

A technique which is useful in the present invention is described by Verbout et al. in "Polarimetric Techniques for Enhancing SAR Imagery" appearing in SPIE vo. 1630 Synthetic Aperture Radar (1992)/141, incorporated hereinto by reference.

The invention specifies an optimal framework for combining multi-coil imagery without a priori knowledge of the individual coil field maps or noise correlation structure.

Starting with a set of N complex images for a selected image FOV, each such image being formed from the output of an individual coil or array element, the general form of the image reconstruction method proceeds as follows:

1) Estimate the array correlation matrix for the desired NMR signal process and/or the noise process, by averaging measured individual image cross-products over a local region or regions in the image FOV consisting of 2 or more pixel coordinates:

$$R_s(j,k)=\Sigma w_s(x,y)C_j(x,y)C_k^*(x,y), j=1, \ldots, N, k=1, \ldots, N, (x,y) \text{ in SROI}$$

$$R_n(j,k)=\Sigma w_n(x,y)C_j(x,y)C_k^*(x,y), j=1, \ldots, N, k=1, \ldots, N, (x,y) \text{ in NROI}$$

where $R_s$ and $R_n$ are the estimated signal and noise correlation matrices, respectively, x and y are image FOV pixel coordinates, SROI is a specified set of pixel coordinates for estimating $R_s$ and, $w_s$ and $w_n$ optional weighting functions which may be employed to bias the respective correlation estimates.

2) Compute the matrix:

$$P=R_n^{-1}R_s$$

where either $R_n$, $R_s$ or both $R_n$ and $R_s$ are computed using the estimation procedure of step 2).

3) Compute the eigenvectors and eigenvalues of the matrix P $$PV_j=\lambda_j V_j, j=1, \ldots, N$$

where $\{V_j, j=1, \ldots, N\}$ is a set of orthogonal eigenvectors for P and $\{\lambda_j, j=1, \ldots, N\}$ is the set of associated eigenvalues of P.

4) Select the optimal complex weight vector, m, as the eigenvector $V_k$ with the largest associated eigenvalue $\lambda_k$:

$$m=V_k \ni |\lambda_k| \geq -|\lambda_j|, j=1, \ldots, N$$

This weight vector is optimal in that it will maximize the output image SNR for the stochastic signal and noise processes specified by $R_s$ and $R_n$ respectively.

5) Apply the complex weight vector m to coherently combine the N individual coil images at one or more pixel coordinates in the image FOV:

$$I(x,y)=\alpha(x,y)\Sigma_k m_k^* C_k(x,y) \text{ in RROI}$$

where (x,y) is the reconstructed output image pixel at coordinates (x,y) RROI is the set of pixel coordinates over which the complex weight vector m is applied, and $\alpha$ is an optional scalar multiplier for achieving certain desirable image characteristics such as uniform noise or uniform sensitivity.

6) Repeat steps 1) through 5) to reconstruct as many regions in the image FOV as desired.

Upon completion of the image reconstruction procedure, standard image processing and scaling procedures may be performed to facilitate the display and evaluation of the reconstructed image I.

In practice, this method works because the spatial characteristics of the NMR signal and noise processes are fundamentally different. The array covariance matrix for the NMR signal is primarily a function of the individual coil field maps. For typical array geometries and coil sizes, $R_s$ varies significantly across an image FOV, but remains nearly constant over a small region. Averaging $R_s$ over a sufficiently localized region results in a signal correlation estimate very close to the true value for any pixel in the region. In contrast, resistive coil noise is spatially white in the image domain, even in cases where the noise is correlated between array elements. Thus, spatial averaging reduces noise-induced bias in the signal correlation estimate without distorting the desired signal-dependent component. It is noteworthy that in the limiting case where $R_s$ is estimated over only a single pixel coordinate, the general reconstruction method reduces the standard "sum of squares" method.

The adaptive reconstruction procedure suppresses motion artifacts through a different mechanism. Unlike random noise, motion artifacts are highly correlated in both the image domain and the array domain. In fact, the array correlation statistics of motion artifacts are identical to the array statistics of the object or flow processes which create the artifacts. Hence, the array statistics of motion artifacts are primarily a function of the individual coil field maps at the source of the artifact. If the artifact source is sufficiently displaced from the region of interest, its associated motion artifacts will have significantly different array correlation estimates for the signal in the region of interest. Given accurate array correlation estimates for the signal and artifact processes, the optimization procedure (steps 2 through 4 of the general method) will compute a complex weight vector to maximize the contrast between the signal and artifact processes. Often, this will create an array pattern with a spatial "null" at the source of the artifact.

The present invention provides for a variety of improvements including, but not limited to:

1. Application of the adaptive optimization procedure, outlined as step 1–6 of the general description of the invention, to the reconstruction of a composite MRI image from multi-coil MRI data.

2. The variation where the signal correlation matrix $R_s$ is estimated directly from the individual coil imagery as specified in step 1) of the general description, and where the noise correlation matrix $R_n$ is assumed to take the form of the identity matrix.

3. The variation where the signal correlation matrix $R_s$ is estimated directly from the individual coil imagery as specified in Step 1) of the general method, but where the noise correlation matrix $R_n$ is estimated through some means other than as specified by step 1) in the general method.

4. The variation where the noise correlation matrix $R_n$ is estimated directly from the individual coil imagery as specified in Step 1) of the general method, but where the signal correlation matrix $R_s$ is estimated through some means other as specified by Step 1) in the general method.

5. The variation where the noise correlation matrix $R_n$ is estimated directly from the individual coil imagery as specified in Step 1) of the general method, but where the array signal response is considered as a deterministic vector g. The signal array response vector g may be known a –priori or estimated through other means. In this variation the optimal reconstruction vector is computed as: $m=R_n^{-1}g$; hence, in this variation the general method reduces to the point-by-point implementation of the deterministic matched filter where the noise correlation matrix is estimated directly from the individual coil to be combined.

6. The variation where the optional scalar multiplier $\alpha$ is selected so as to produce an image with approximately uniform noise. In this variation the scalar multiplier is computed as: $\alpha=1/\text{sqrt}(m^H R_n m)$.

7. The variation where the optional scalar multiplier is selected so as to produce an image with approximately uniform sensitivity. In this variation a number of existing methods may be employed to estimate α, such as those described in U.S. Pat. Nos. 5,587,656, 5,600,244, 5,208,534, all of which are incorporated hereinto by reference.

8. The variation where the covariance matrix (the zero-mean form of the correlation matrix function) is substituted in place of the correlation matrix function.

9. The variation where the relative phase shifts and magnitude levels between coil outputs are estimated independently (as opposed to jointly, as in Step 1 of the general method) by averaging over a local region or regions of the image FOV. In this variation the independently estimated magnitude and phase statistics are used to construct the correlation matrices in the general method.

10. The variation where the signal and/or noise correlation matrices are estimated over a local region or regions of a scout image, and where the derived reconstruction vector m is employed to reconstruct subsequent images period. In this variation the reconstruction vector m may be applied to coherently combine raw multi-coil data sets prior to image formation, thus minimizing the overall computational burden of the image formation process.

11. The variation where the signal and/or noise correlation matrices are computed over a 3-dimensional image volume.

12. The variation where the derived reconstruction vector is applied to reconstruct a 3-dimensional image volume.

13. The variation where the signal and/or noise correlation matrices are computed over more than one 2-D or 3-D image. This variation is useful for averaging array correlation statistics over time.

14. The variation where a graphical user interface (GUI) is employed to assist the user in selecting image regions for estimating signal and/or noise covariance matrices. In a preferred embodiment, the GUI would include drawing tools for outlining and selecting regions of interest, and the user would interact with the GUI primarily through a mouse or other manual input device.

While the preferred procedure operates on a pixel-by-pixel basis, a variety of other operations are available. One such operation is where the technique is applied block-by-block (i.e. the sample correlation matrix $R_s$ is computed over a local block of pixels, and the derived reconstruction vector m is applied to the same block of pixels or a subset of this block).

The procedure of this invention is also applicable to reconstruct the entire image via a single reconstruction vector m. This embodiment of the technique is useful for real-time image reconstruction. In such cases, the reconstruction procedure is reordered such that the step involving the image formation is performed last. The raw complex data sets are coherently combined prior to image formation, using a vector m computed over a selected region of interest in a "scout" image. This results in a significant reduction in computational burden since only a single image is formed as opposed to N images.

The invention, together with various embodiments thereof, will be more fully explained by the accompanying drawings the associated description.

DRAWINGS IN BRIEF

DRAWINGS IN DETAIL

Figure 1:
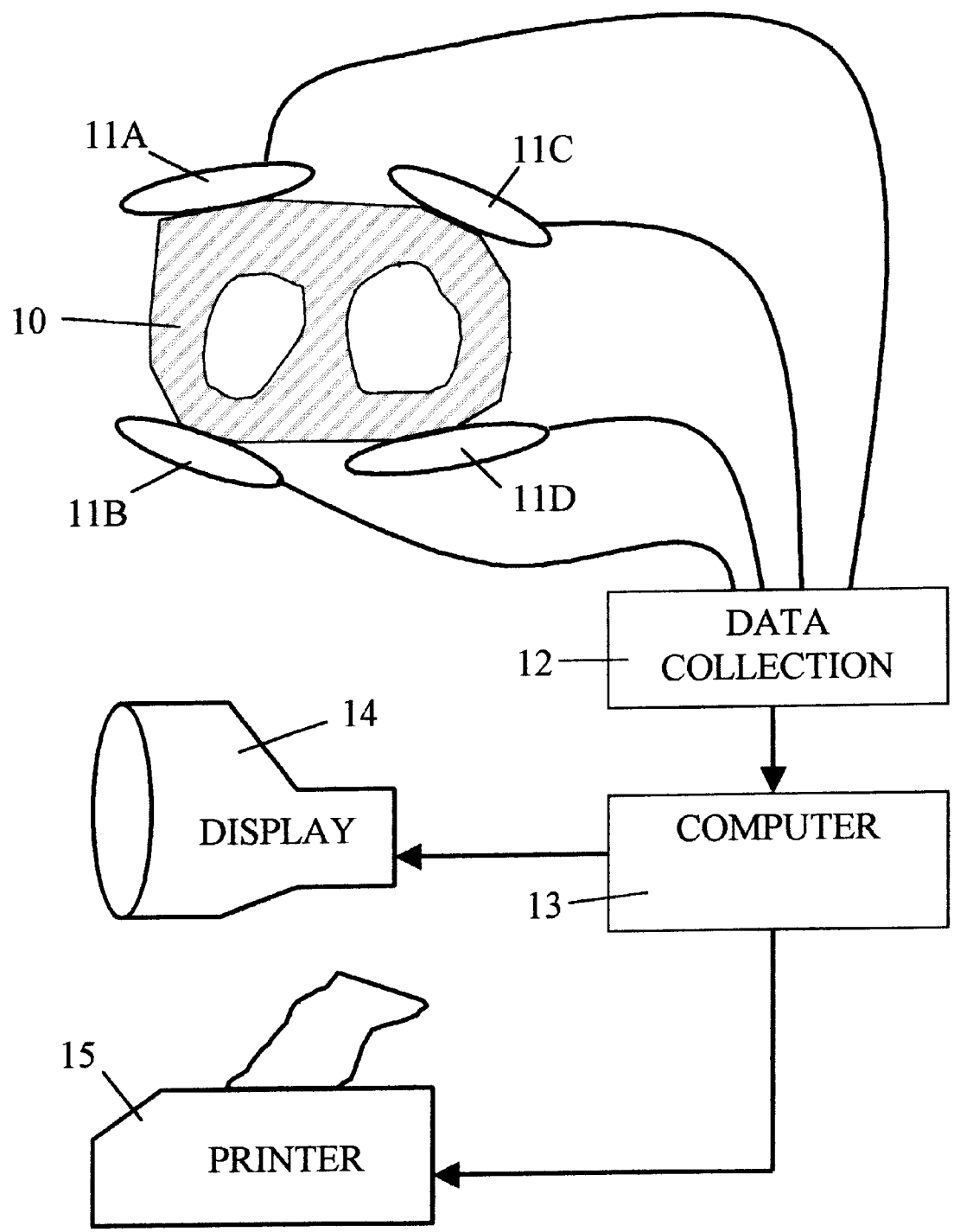
FIG. 1 is a functional diagram of a phased array mechanism of this invention.

FIG. 1 is a functional diagram of a phased array mechanism of this invention.

In this illustration, patient 10 is being scanned by imaging loops 11A, 11B, 11C, and 11D. While this illustration shows the use of four imaging loops, the invention is not intended to be so limited. Use of any number of loops are contemplated by this invention.

The raw data from imaging loops 11A, 11B, 11C, and 11D, is communicated to data collection mechanism 12 which collects the raw data for use by computer 13. Employing the technique described in FIG. 2, computer 13 creates a reconstructed image from the raw data in data collection mechanism 12.

The reconstructed image is communicated to the operator using either display 14 or printer 15.

Figure 2:
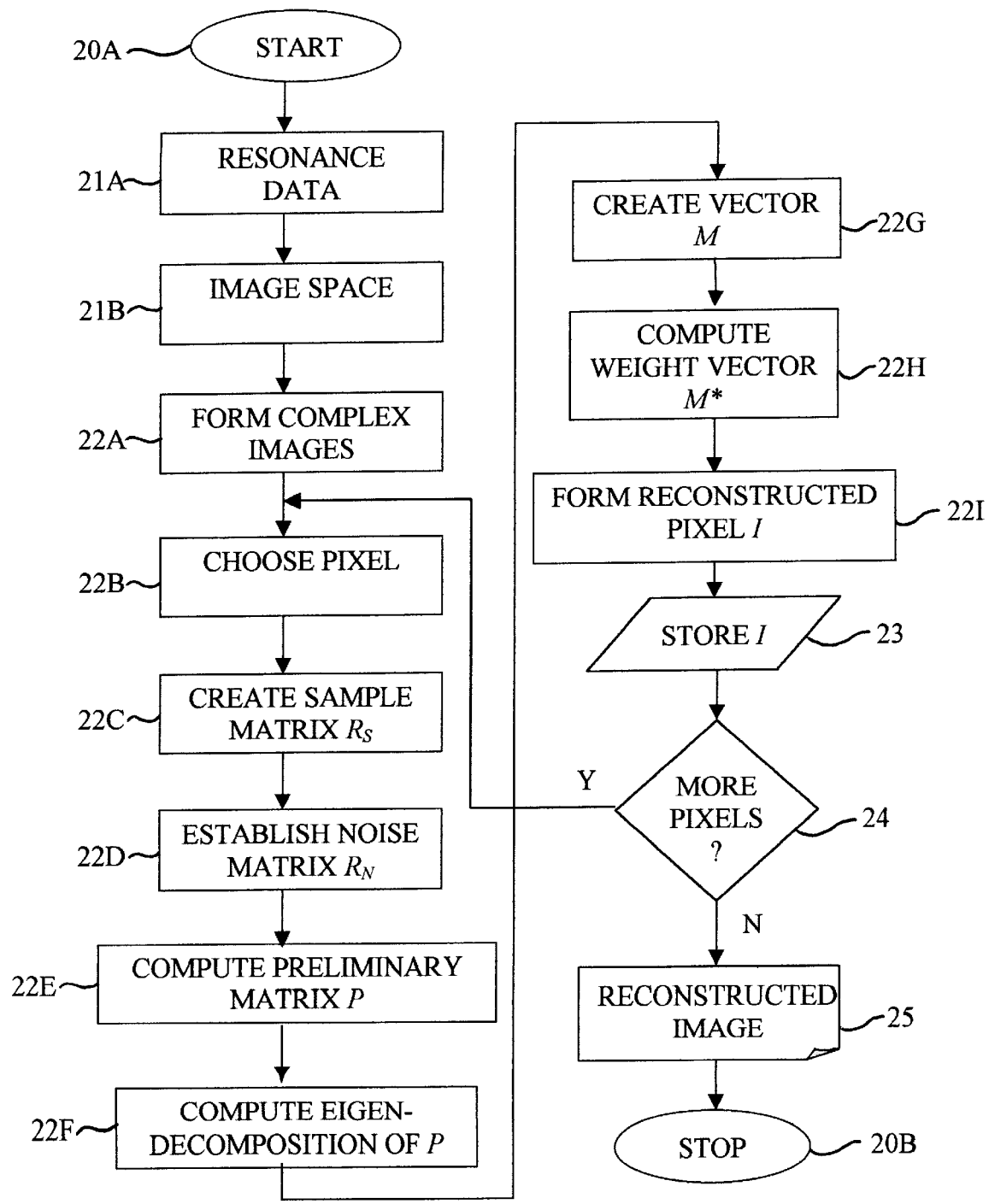
FIG. 2 is a flow-chart of the preferred technique for the performance of this invention.

FIG. 2 is a flow-chart of the preferred technique for the performance of this invention.

Once the program has been started, 20A, the resonance data 21A is collected using N coils. In this invention, N>1. The coils create N sets of nuclear magnetic resonance data sets, each of said data sets having a multitude of sample values.

The image space 21B is then established. Establishment of the image space is either done automatically by the system or the operator is allowed to define which image space is of interest.

Complex images are created 22B within the image space. These complex images are formed from the data sets constituting the resonance data. Each complex images is defined as $\{C_j, j=1, \ldots, N\}$ of an image space. Each of the N complex image formed from data from a single coil.

The program then chooses a pixel to be considered 22B. While some embodiments of the invention work their way through the image pixel by pixel, other embodiments concentrate on a few pixels.

The sample matrix $R_s$ is then established 22C. The task of mathematically creating a sample matrix $R_s$ is accomplished by averaging a complex cross products of the images $\{C_j, j=1, \ldots, N\}$ over two or more pixel locations in the image space. Note, while a single pixel is chosen as that of interest, the sample matrix $R_s$ is created over a grouping of pixels. In one embodiment of the invention, this grouping is a 32×32 array of pixels.

The noise matrix $R_N$ is created 22D using a variety of techniques well known to those of ordinary skill in the art. In some applications of the invention, the noise matrix is assumed to be an identify matrix; in other embodiments the noise matrix is established using a sample space within the overall image which the operator identifies as being "noise".

Using the sample matrix and the noise matrix, a preliminary matrix is established 22E using the formula:

$$P = R_n^{-1} \times R_s.$$

This preliminary matrix P is used to form the Eigen decompositions P' 22F. From P, the Eigen de-composition P' is created. Matrix P' consists of a set of Eigenvectors $\{V_j, j=1, \ldots, N\}$ and associated Eigenvalues $\{\lambda_j, j=1, \ldots, N\}$.

The Eigen de-composition P' is used to form a vector m, 22G, which is the eigenvector with the maximal assoiated eigenvalue among all the Eigenvalues of P'. Hence, m=Maximum $V_k$, K=1, ..., N, whose associated Eigenvalue $\lambda_k$ has the maximal magnitude among all the Eigenvalues ($|\lambda_k| \geq |\lambda_j|$, j=1, ..., N).

Vector m is key to the creation of a weighting vector m*, 22H, which is the complex conjugate value of m.

The computational task is completed when the reconstructed pixel is created 22I. The reconstructed pixel I is derived by the equation:

$$I = \sum_{J=1}^{N} m_j^* C_j.$$

The value of the reconstructed pixel I is stored 23, and the program determines if there are more pixels to reconstruct 24. If there are more pixels 24, then the program loops back to choose the next pixel 22B; otherwise, the reconstructed image is displayed 25 and the program stops 20B.

It is clear that the present invention creates a highly improved Phased Array NMR image.

What is claimed is:

1. A method reconstructing a phased array nuclear magnetic resonance image comprising the steps of:
   a) using N coils, N>1, collecting N sets of nuclear magnetic resonance data, each of said data sets having a multitude of sample values;
   b) from said data sets, forming N complex images $\{C_j, j=1, \ldots, N\}$ of an image space, each of said N complex images formed from data from a single coil; and,
   c) for a chosen pixel within an image space, forming a reconstructed pixel formed by the steps of:
      1) mathematically creating a sample correlation matrix $R_s$ by averaging complex cross products of the images $\{C_j, j=1, \ldots N\}$ over two or more pixel locations in the image space,
      2) establishing a noise array correlation matrix, $R_n$,
      3) computing a preliminary matrix $P = R_n^{-1} \times R_s$,
      4) from P, establishing an Eigen de-composition P', consisting of a set of Eigenvectors $\{V_j, j=1, \ldots, N\}$ and associated Eigenvalues $\{\lambda_j, j=1, \ldots, N\}$,
      5) from P', establishing a vector m being the Eigenvector $V_k$ whose associated Eigenvalue $\lambda_k$ has the maximal magnitude among all the Eigenvalues ($|\lambda_k|$ > $|\lambda_j|$, j=1, \ldots, N),
      6) creating a pixel weight vector m* formed as a complex conjugate value of m, and,
      7) forming the reconstructed pixel I where I=

$$I = \sum_{J=1}^{N} m_j^* C_j.$$

2. The method according to claim 1, further including the steps of:
   a) receiving an identified noise space; and,
   b) wherein said noise array correlation matrix $R_n$ is determined over said identified noise space.

3. The method according to claim 2, wherein said identified noise space is operator defined.

4. The method according to claim 1, wherein said image space is constructed over at least three dimensions.

5. The method according to claim 4, wherein said noise array correlation matrix is constructed over at least three dimensions.

6. The method according to claim 1, further including the step of applying the pixel weight vector m* to reconstruct said image in three dimensions.

7. The method according to claim 1, wherein the step of forming a reconstructed pixel is performed for each pixel within said N complex images formed from data from a single coil.

8. The method according to claim 1,
   a) further including the step of establishing a block size defining a two dimensional array of pixels; and,
      wherein the step of forming a reconstructed pixel is performed over a range of pixels within said N complex images corresponding to said block size.

9. The method according to claim 1, wherein said pixel weight vector m* is computed a single time for a particular N complex image.

10. The method according to claim 1, wherein the step of establishing a noise array correlation matrix $R_n$ is created from nuclear magnetic resonance data not within said N sets of nuclear magnetic resonance data.

11. An imaging method for reconstructing an image from a phased array nuclear magnetic resonance image having N coils, N>1, each coil generating a data set, said method comprising the steps of:
   a) from said data sets, forming N complex images $\{C_j, j=1, \ldots N\}$ of an image space, each of said N complex images formed from data from a single coil; and,
   b) reconstructing a pixel within said by:
      1) mathematically creating a sample correlation matrix $R_s$ by averaging complex cross products of the images $\{C_j, j=1, \ldots N\}$ over two or more pixel locations in the image space,
      2) establishing a noise array correlation matrix, $R_n$,
      3) computing a preliminary matrix $P = R_n^{-1} \times R_s$,
      4) from P, establishing an Eigen de-composition P', consisting of a set of Eigenvectors $\{V_j, j=1, \ldots, N\}$ and associated Eigenvalues $\{\lambda_j, j=1, \ldots, N\}$,
      5) from P', establishing a vector m being the Eigenvector $V_k$ whose associated Eigenvalue $\lambda_k$ has the maximal magnitude among all the Eigenvalues ($|\lambda_k|$ ≥ $|\lambda_j|$, j=1, \ldots, N),
      6) creating a pixel weight vector m* formed as a complex conjugate value of m, and,
      7) forming the reconstructed pixel I where I=

$$I = \sum_{J=1}^{N} m_j^* C_j.$$

12. The imaging method according to claim 11, further including the steps of:
   a) receiving an identified noise space; and,
   b) wherein said noise array correlation matrix $R_n$ is determined over said identified noise space.

13. The imaging method according to claim 12, wherein said identified noise space is operator defined.

14. The imaging method according to claim 11, wherein said image space is constructed over at least three dimensions.

15. The imaging method according to claim 14, wherein said noise array correlation matrix is constructed over at least three dimensions.

16. The imaging method according to claim 11, further including the step of applying the pixel weight vector m* to reconstruct said image in three dimensions.

17. The imaging method according to claim 11, wherein the step of forming a reconstructed pixel is performed for each pixel within said N complex images formed from data from a single coil.

18. The imaging method according to claim 11,
   a) further including the step of establishing a block size defining a two dimensional array of pixels; and,
      wherein the step of forming a reconstructed pixel is performed over a range of pixels within said N complex images corresponding to said block size.

19. The imaging method according to claim 11, wherein said pixel weight vector m* is computed a single time for a particular N complex image.

20. The method according to claim 11, further including the step of establishing a noise array correlation matrix $R_n$ is created from nuclear magnetic resonance data not within said N sets of nuclear magnetic resonance data.

* * * * *